(12) United States Patent
Yu et al.

(10) Patent No.: US 12,733,551 B2
(45) Date of Patent: Sep. 8, 2026

(54) APPARATUS FOR MANUFACTURING DISPLAY DEVICE AND METHOD OF MANUFACTURING DISPLAY DEVICE

(71) Applicant: Samsung Display Co., LTD., Yongin-si (KR)

(72) Inventors: Hyung Jun Yu, Yongin-si (KR); Jong Won Kim, Yongin-si (KR); Sung Ho Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 385 days.

(21) Appl. No.: 18/325,258

(22) Filed: May 30, 2023

(65) Prior Publication Data

US 2024/0021590 A1 Jan. 18, 2024

(30) Foreign Application Priority Data

Jul. 14, 2022 (KR) ........................ 10-2022-0087168

(51) Int. Cl.
*H10W 90/00* (2026.01)
*H10H 20/01* (2025.01)

(52) U.S. Cl.
CPC ............ *H10W 90/00* (2026.01); *H10H 20/01* (2025.01)

(58) Field of Classification Search
CPC ............. H01L 25/0753; H01L 21/6715; H01L 21/67017; H10H 20/01; H05B 33/10; H10W 90/00; H10P 72/0402; H10P 72/0448
See application file for complete search history.

(56) References Cited

U.S. PATENT DOCUMENTS

| | | | |
|---|---|---|---|
| 10,658,605 | B2 | 5/2020 | Lee et al. |
| 12,243,963 | B2 | 3/2025 | Ko et al. |
| 2008/0271751 | A1 | 11/2008 | Lee |
| 2023/0078237 | A1 | 3/2023 | Lee et al. |

FOREIGN PATENT DOCUMENTS

| | | | | |
|---|---|---|---|---|
| JP | 2008-098561 | 4/2008 | | |
| KR | 10-0924881 | 11/2009 | | |
| KR | 10-2021-0077847 | 6/2021 | | |
| KR | 10-2021-0107988 A | 9/2021 | | |
| KR | 10-2022-0017024 A | 2/2022 | | |
| KR | 10-2407848 | 6/2022 | | |
| WO | WO-2020141652 A1 * | 7/2020 | ............ | B41J 2/2135 |

* cited by examiner

*Primary Examiner* — Ratisha Mehta
(74) *Attorney, Agent, or Firm* — Womble Bond Dickinson (US) LLP

(57) ABSTRACT

A method of manufacturing a display device includes discharging ink including light emitting elements onto a substrate; applying a first electric field to the substrate to fix the light emitting elements; removing foreign substances from the substrate by using a cleaning device in a state in which the first electric field is applied to the substrate; and releasing application of the first electric field after the removing of the foreign substances from the substrate by using the cleaning device.

10 Claims, 13 Drawing Sheets

1000

LD SL

200

INK

INK

10

100

APPARATUS FOR MANUFACTURING DISPLAY DEVICE AND METHOD OF MANUFACTURING DISPLAY DEVICE

CROSS-REFERENCE TO RELATED APPLICATION

The application claims priority to and benefits of Korean Patent Application No. 10-2022-0087168 under 35 U.S.C. § 119, filed in the Korean Intellectual Property Office on Jul. 14, 2022, the entire contents of which are incorporated herein by reference.

BACKGROUND

1. Technical Field

The disclosure relates to a method of manufacturing a display device and an apparatus for manufacturing the display device, which is capable of removing foreign substances from a substrate.

2. Description of the Related Art

In recent years, as interest in information displays increases, research and development on display devices are continuously being made.

It is to be understood that this background of the technology section is, in part, intended to provide useful background for understanding the technology. However, this background of the technology section may also include ideas, concepts, or recognitions that were not part of what was appreciated by those skilled in the pertinent art prior to a corresponding effective filing date of the subject matter disclosed herein.

SUMMARY

An objective of the disclosure is to provide an apparatus for manufacturing a display device capable of removing foreign substances from a substrate through a cleaning process after spraying a light emitting element onto the substrate, and a method of manufacturing the display device.

However, embodiments of the disclosure are not limited to those set forth herein. The above and other embodiments will become more apparent to one of ordinary skill in the art to which the disclosure pertains by referencing the detailed description of the disclosure given below.

A method of manufacturing a display device according to embodiments of the disclosure may include discharging ink including light emitting elements onto a substrate; applying a first electric field to the substrate to fix the light emitting elements; removing foreign substances from the substrate by using a cleaning device in a state in which the first electric field is applied to the substrate; and releasing application of the first electric field after the removing of the foreign substances from the substrate by using the cleaning device.

According to an embodiment, the method of manufacturing a display device may further include applying a second electric field to the substrate to align the light emitting elements after the releasing of the first electric field.

According to an embodiment, the light emitting elements may be arranged and fixed in a random direction by the first electric field, and the light emitting elements may be arranged in a direction by the second electric field.

According to an embodiment, the method of manufacturing a display device may further include removing a solvent included in the ink in a state in which the second electric field is applied to the substrate.

According to an embodiment, the method of manufacturing a display device may further include discharging additional ink onto the substrate after application of the second electric field is released.

According to an embodiment, the discharging of the additional ink may include measuring a number of the light emitting elements on the substrate; comparing the number of the light emitting elements with a reference value; and discharging the additional ink onto the substrate in case that a measured number of the light emitting elements is not included in the reference value.

According to an embodiment, the removing of the foreign substances on the substrate may include spraying gas onto the substrate, and sucking the foreign substances from the substrate.

According to an embodiment, the removing of the foreign substances on the substrate may include air-floating the substrate, and passing the substrate through the cleaning device.

According to an embodiment, the cleaning device may include an ultrasonic cleaner.

An apparatus for manufacturing a display device according to embodiments of the disclosure may include a stage supporting a substrate; an inkjet head discharging ink including light emitting elements onto the substrate; an electric field applying device applying a first electric field to the substrate to fix the light emitting elements; and a cleaning device removing foreign substances from the substrate in a state in which the first electric field is applied to the substrate. The electric field applying device may release application of the first electric field after the cleaning device removes the foreign substances.

According to an embodiment, the electric field applying device may apply a second electric field to the substrate to align the light emitting elements after the application of the first electric field is released.

According to an embodiment, the light emitting elements may be arranged and fixed in a random direction by the first electric field, and the light emitting elements may be arranged in a direction by the second electric field.

According to an embodiment, the apparatus for manufacturing a display device may further include a light irradiation device irradiating the light to the substrate. The light irradiation device may irradiate light onto the substrate in a state in which the second electric field is applied to the substrate.

According to an embodiment, the inkjet head may discharge additional ink onto the substrate after the application of the first electric field is released.

According to an embodiment, the apparatus for manufacturing a display device may further include a processor controlling at least one of the substrate, the inkjet head, the electric field applying device, and the cleaning device. The processor may measure a number of the light emitting elements on the substrate and control the inkjet head based on a result of comparing the number of the light emitting elements with a reference value.

According to an embodiment, the inkjet head may discharge the additional ink onto the substrate in case that a measured number of the light emitting elements is not included in the reference value.

According to an embodiment, the cleaning device may include a gas supply part spraying gas onto the substrate; and a gas suction part sucking the foreign substances and residual gas from the substrate.

According to an embodiment, the apparatus for manufacturing a display device may further include a driving part driving the stage. The driving part may control the stage so that the substrate to which the first electric field is applied pass through the cleaning device.

According to an embodiment, the driving part may include at least one of an air floating device, a roller conveyor device, a transport device connected to the substrate, and a transport device connected to the cleaning device.

According to an embodiment, the cleaning device may include an ultrasonic cleaner.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
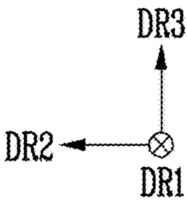
FIG. 1 is a schematic diagram illustrating an example of an operation of an inkjet head of an apparatus for manufacturing a display device according to embodiments of the disclosure.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Although the terms "first," "second," and the like may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic diagram illustrating an example of an operation of an inkjet head 200 of an apparatus 1000 for manufacturing a display device according to embodiments of the disclosure.

Referring to FIG. 1, the apparatus 1000 for manufacturing a display device may include a substrate 10, a stage 100, and an inkjet head 200.

In FIG. 1, a first direction DR1, a second direction DR2, and a third direction DR3 may be defined. The first direction DR1 and the second direction DR2 may be located on a same plane and orthogonal to each other. The third direction DR3 may be a direction perpendicular to the first direction DR1 and the second direction DR2. In the drawings, the first direction DR1 may refer to a vertical direction, the second direction DR2 may refer to a horizontal direction, and the third direction DR3 may refer to upper and lower directions.

In an embodiment, the apparatus 1000 for manufacturing a display device may discharge an ink INK (e.g., a predetermined or selectable ink) onto the substrate 10 using the inkjet head 200.

In an embodiment, the stage 100 may support the substrate 10. The substrate 10 may be seated on the stage 100.

In an embodiment, the inkjet head 200 may spray, discharge, or print the ink INK including a light emitting element LD (or light emitting elements LD) and a solvent SL on the substrate 10.

In an embodiment, the ink INK may include the solvent SL and the light emitting element LD dispersed in the solvent SL. In an example, the ink INK may include multiple light emitting elements LD dispersed in the solvent SL.

In an embodiment, the ink INK may be provided in a solution or colloidal state. For example, the solvent SL may include at least one of acetone, water ($H_2O$), alcohol, toluene, propylene glycol (PG), and propylene glycol methyl acetate (PGMA). However, the disclosure is not limited thereto.

In an embodiment, the light emitting element LD, which is dispersed in the solvent SL, may be discharged onto the substrate 10 through the inkjet head 200. In an example, the light emitting element LD, which is dispersed in the solvent SL, may be discharged onto the substrate 10 in the form of ink INK droplets through the inkjet head 200.

Figure 2:
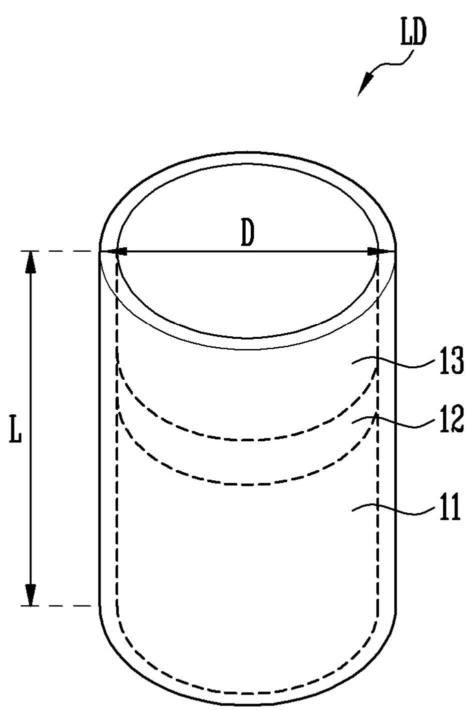
FIG. 2 is a schematic diagram illustrating an example of a light emitting element included in ink discharged from the inkjet head of FIG. 1.

FIG. 2 is a schematic diagram illustrating an example of a light emitting element LD included in ink INK discharged from the inkjet head 200 of FIG. 1.

Referring to FIG. 2, the light emitting element LD may include a first semiconductor layer 11, a second semiconductor layer 13, and an active layer 12 disposed between the first semiconductor layer 11 and the second semiconductor layer 13. In an example, the light emitting element LD may be implemented as a light emitting laminate (or laminated pattern) in which the first semiconductor layer 11, the active layer 12, and the second semiconductor layer 13 are sequentially stacked.

In an embodiment, the light emitting element LD may have a rod-type, bar-type, or pillar-type shape, which is long and has an aspect ratio greater than about 1 in a longitudinal direction. However, the disclosure is not limited thereto, and the light emitting element LD may have a rod-type shape, a bar-type shape, or a pillar-type shape, which is short and has an aspect ratio less than about 1 in a longitudinal direction.

In an embodiment, the light emitting element LD may have a diameter D and/or a length L of a nano scale (or nanometers) or a micro scale (or micrometers). The light emitting element LD may include a light emitting diode (LED) manufactured in a very small size (e.g., in a range of a nano scale to a micro scale). For example, when the light emitting element LD is long in the longitudinal direction, the diameter D of the light emitting element LD may be in a range of about 0.5 μm to about 6 μm, and the length L may be in a range of about 1 μm to about 10 μm. However, the diameter D and the length L of the light emitting element LD are not limited thereto. The size of the light emitting element LD may be changed based on a requirement (or design condition) of a lighting device or a self-light emitting display device to which the light emitting element LD is applied.

In an embodiment, the first semiconductor layer 11 may include at least one n-type semiconductor layer. For example, the first semiconductor layer 11 may include at least one semiconductor material of InAlGaN, GaN, AlGaN, InGaN, AN, and InN. The first semiconductor layer 11 may be an n-type semiconductor layer doped with a first conductive dopant (or an n-type dopant), such as silicon (Si), germanium (Ge), tin (Sn), or the like. However, the material constituting the first semiconductor layer 11 is not limited thereto, and may include various other materials. The first semiconductor layer 11 may include a first surface in contact with the active layer 12 in the longitudinal direction of the light emitting element LD and a second surface exposed to outside.

In an embodiment, the active layer 12 may be disposed on the first semiconductor layer 11 and may be formed in a single or multiple quantum well structure. In an example, in case that the active layer 12 is formed in the multiple quantum well structure, the active layer 12 may be formed in a structure in which a barrier layer, a strain reinforcing layer, and a well layer are periodically and repeatedly stacked as one unit. The strain reinforcing layer may have a smaller lattice constant than the barrier layer, and may apply a compressive strain to the well layer. However, the structure of the active layer 12 is not limited to the above-described embodiment.

In an embodiment, the active layer 12 may emit light having a wavelength in a range of about 400 nm to about 900 nm. The active layer 12 may have a double hetero structure. In an example, a clad layer (not shown) doped with a conductive dopant may be formed on upper and/or lower portions of the active layer 12 in the longitudinal direction of the light emitting element LD. In an example, the clad layer may be formed of an AlGaN layer or an InAlGaN layer. Materials such as AlGaN and InAlGaN may be used to form the active layer 12, and various other materials may be included in the active layer 12. The active layer 12 may include a first surface in contact with the first semiconductor layer 11 and a second surface in contact with the second semiconductor layer 13.

In an embodiment, when an electric field of a voltage (e.g., a predetermined or selectable voltage) or more is applied to ends (e.g., both ends) of the light emitting element LD, electron-hole pairs may be combined in the active layer 12, and the light emitting element LD may emit light. The light emitting element LD may be used as a light source (or light emitting source) of a display device.

In an embodiment, the second semiconductor layer 13 may be disposed on the second surface of the active layer 12, and may include a semiconductor layer of a different type from a type of the first semiconductor layer 11. In an example, the second semiconductor layer 13 may include at least one p-type semiconductor layer. For example, the second semiconductor layer 13 may include a p-type semiconductor layer including at least one semiconductor material of InAlGaN, GaN, AlGaN, InGaN, AN, and InN, and doped with a second conductive dopant (or a p-type dopant) such as magnesium (Mg), zinc (Zn), calcium (Ca), strontium (Sr), barium (Ba), or the like. However, the second semiconductor layer 13 is not limited thereto, and may include various other materials. The second semiconductor layer 13 may include a first surface in contact with the second surface of the active layer 12 in the longitudinal direction of the light emitting element LD and a second surface exposed to the outside.

Figure 3:
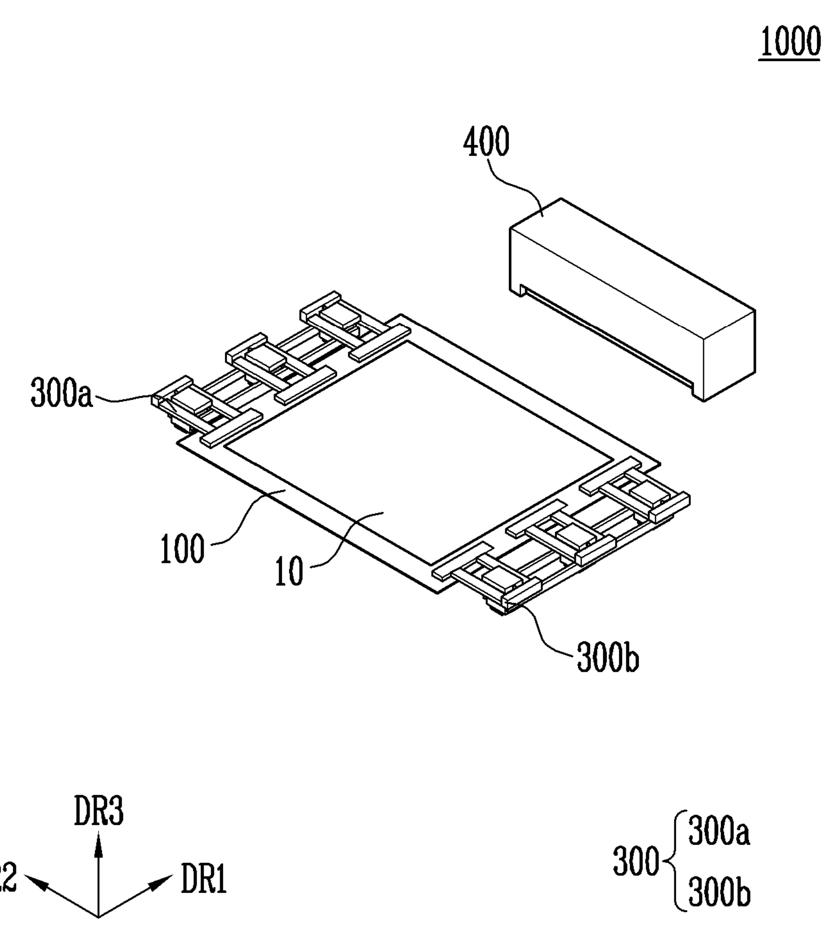
FIG. 3 is a schematic diagram illustrating the apparatus for manufacturing a display device according to embodiments of the disclosure.

FIG. 3 is a schematic diagram illustrating the apparatus 1000 for manufacturing a display device according to embodiments of the disclosure.

In an embodiment, the apparatus 1000 for manufacturing a display device may include the substrate 10, the stage 100, an electric field applying device 300, and a cleaning device 400. The apparatus 1000 for manufacturing a display device may further include an inkjet head (e.g., the inkjet head 200 of FIG. 1).

In an embodiment, the stage 100 may support the substrate 10. The substrate 10 may be seated on the stage 100.

In an embodiment, the ink (e.g., the ink INK of FIG. 1) may be sprayed onto the substrate 10 through the inkjet head 200. The electric field applying device 300 may apply an electric field to the substrate 10 onto which the ink INK is sprayed.

In an embodiment, the electric field applied by the electric field applying device 300 may be formed on the substrate 10 onto which the ink INK is sprayed. In an example, the electric field may be transferred to the ink INK sprayed on the substrate 10. The light emitting element LD included in the ink INK may be fixed or aligned on the substrate 10 by the electric field.

In an embodiment, the electric field applying device 300 may include a first electric field applying device 300*a* and a second electric field applying device 300*b*.

In an embodiment, the first and second electric field applying devices 300*a* and 300*b* may be disposed at ends (e.g., both ends) of the substrate 10. In an example, the first electric field applying device 300*a* may be disposed at an end of the substrate 10 in the second direction DR2. The second electric field applying device 300*b* may be disposed at another end of the substrate 10 in the second direction DR2. Accordingly, in case that the first and second electric field applying devices 300*a* and 300*b* disposed at the ends (e.g., both ends) of the substrate 10 are activated, the electric field may be formed on the substrate 10.

In an embodiment, in case that the electric field is formed on the substrate 10 onto which the ink INK is sprayed by the first and second electric field applying devices 300*a* and 300*b*, the light emitting element LD included in the ink INK may be oriented in the second direction DR2 in which the electric field is formed.

In an embodiment, the electric field applying device 300 may apply a first electric field (e.g., the first electric field IEL' of FIG. 5) to the substrate 10 and fix the light emitting element LD included in the ink INK. For example, the position of the light emitting element LD may be fixed on the substrate 10 by the first electric field TEL'.

In an embodiment, the electric field applying device 300 may apply a second electric field (e.g., the second electric field IEL" of FIG. 8) to the substrate 10 and align the light emitting element LD included in the ink INK. For example, the light emitting element LD may be aligned on the substrate 10 by the second electric field TEL".

In an embodiment, the first electric field TEL' may have a value (e.g., an intensity) different from a value (e.g., an intensity) of the second electric field IEL" In an example, the second electric field TEL" for aligning the light emitting element LD may be greater than the first electric field TEL' for fixing the light emitting element LD. However, the disclosure is not limited thereto, and the first electric field IEL' and the second electric field IEL" may be variously set according to the shape, characteristic, component, process condition, etc. of the light emitting element LD.

In an embodiment, the first electric field IEL' may correspond to an electric field for fixing the light emitting element LD regardless of the direction of the electric field formed on the substrate 10. Accordingly, the light emitting element LD may be fixedly arranged in a random direction on the substrate 10 by the first electric field IEL'.

In an embodiment, since the second electric field TEL" corresponds to an electric field for aligning the light emitting element LD in a direction (e.g., a specific or selectable direction), the light emitting element LD may be aligned in the direction by the second electric field IEL".

In an embodiment, the cleaning device 400 may be disposed in the first direction DR1 of the substrate 10.

In an embodiment, the cleaning device 400 may remove foreign substances and the like from the substrate 10. The foreign substances may include foreign substances included in the ink INK sprayed onto the substrate 10 or foreign substances generated during a process.

In an embodiment, the substrate 10 may move in the first direction DR1 and pass through the cleaning device 400, and foreign substances may be removed from the substrate 10. In an example, the cleaning device 400 may spray gas onto the substrate 10 through a gas supply part (e.g., the gas supply part 410 of FIG. 6) and remove foreign substances from the substrate 10. The cleaning device 400 may suck (or inhale) foreign substances and residual gas on the substrate 10 through a suction part (e.g., the suction part 420 of FIG. 6).

In an embodiment, the cleaning device 400 may include a plasma cleaning device. In an example, the cleaning device 400 may generate plasma by applying a high frequency to the gas, and may irradiate the plasma to the substrate 10 to remove foreign substances from the substrate 10 by a chemical reaction. The foreign substances on the substrate 10 may be scattered into the air by oxygen gas and argon gas, and the scattered foreign substances may be sucked into the cleaning device 400.

In an embodiment, after the ink INK is sprayed onto the substrate 10, the substrate may be moved in the first direction DR1 and pass through the cleaning device 400. In a cleaning process, the light emitting element LD included in the ink INK may be separated from the substrate 10 or the arrangement of the light emitting element LD on the substrate 10 may be changed. For example, in order to perform the cleaning process for removing foreign substances from the substrate 10 on which the ink INK is sprayed, the light emitting element LD must be fixed to prevent the light emitting element LD from being separated from the substrate 10 or the position of the light emitting element LD from being changed on the substrate 10 during the cleaning process. For example, before the substrate 10 moves in the first direction DR1 and passes through the cleaning device 400, the electric field applying device 300 may apply an electric field (e.g., the first electric field IEL' of FIG. 5) to at least temporarily fix the light emitting element LD on the substrate 10.

In an embodiment, the cleaning device 400 may include an ultrasonic cleaner. In an example, the ultrasonic cleaner may separate foreign substances from the substrate 10 using cavitation of ultrasonic waves, and may suck the foreign substances through the cleaning device 400. Thus, the separated foreign substances may not adhere to the substrate 10 again.

FIGS. 4A to 4D are schematic diagrams illustrating examples of the apparatus for manufacturing a display device of FIG. 3.

Referring to FIGS. 4A to 4D, apparatuses 1000*a*, 1000*b*, 1000*c*, and 1000*d* for manufacturing a display device may move the substrate 10 and the stage 100 in the first direction DR1 using driving parts 600*a*, 600*b*, 600*c*, and 600*d*. In an example, the substrate 10 may be disposed on the stage 100 and the electric field applying device 300 may be disposed at the ends (e.g., both ends) of the substrate 10. The substrate 10 and the electric field applying device 300 may be moved in the first direction DR1 by the driving parts 600*a*, 600*b*, 600*c*, and 600*d* and pass through the cleaning device 400. The apparatuses 1000*a*, 1000*b*, 1000*c*, and 1000*d* for manufacturing a display device may control the driving parts 600*a*, 600*b*, 600*c*, and 600*d*. Thus, the substrate 10 disposed on the stage 100 may pass through the cleaning device 400 disposed in the first direction DR1.

Figure 4A:
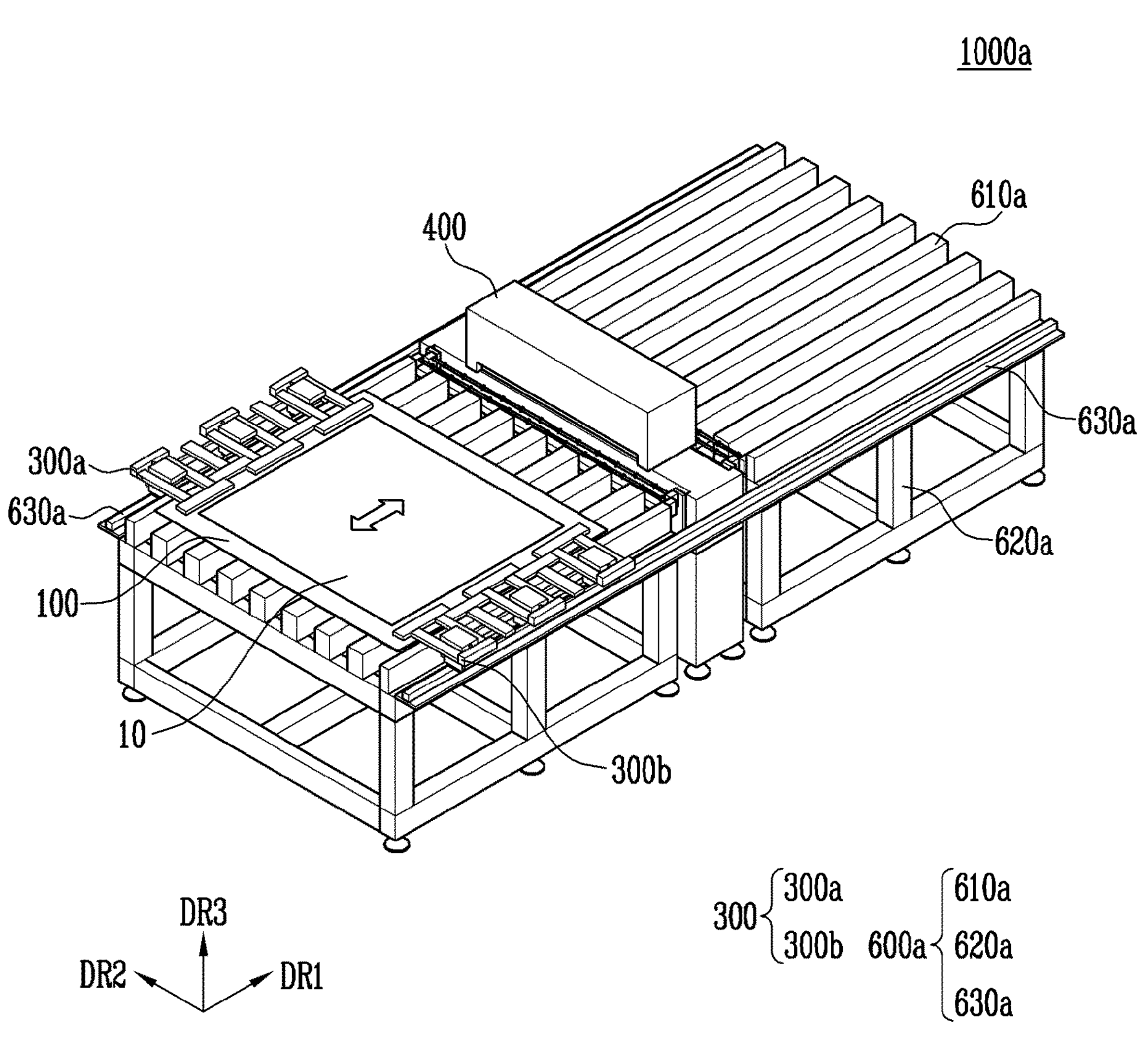
FIGS. 4A to 4D are schematic diagrams illustrating examples of the apparatus for manufacturing a display device of FIG. 3.

Referring to FIG. 4A, the apparatus 1000*a* for manufacturing a display device may include the substrate 10, the stage 100, the electric field applying device 300, the cleaning device 400, and the driving part 600*a*.

In an embodiment, the driving part 600*a* may include an air floating part 610*a*, a support frame 620*a*, and a guide member 630*a*.

In an embodiment, the air floating part 610*a* may include multiple air floating parts, and the multiple air floating parts may extend in the first direction DR1 and may be arranged in the second direction DR2. The guide member 630*a* may extend in the first direction DR1 and support the electric field applying device 300 disposed at the ends (e.g., both ends) of the substrate 10. The support frame 620*a* may support the air floating part 610*a* and the guide member 630*a*.

In an embodiment, the cleaning device 400 may be disposed in at least one area of the air floating part 610*a* disposed in the first direction DR1.

In an embodiment, the substrate 10 and the electric field applying device 300 coupled to the ends (e.g., both ends) of the substrate 10 and the guide member 630*a* may be moved along the guide member 630*a* by the air floating part 610*a*. The substrate 10 may be moved in the first direction DR1 in an air floating manner by the air floating part 610*a*. The substrate 10 may pass through the cleaning device 400 disposed in the first direction DR1 in an air floating manner by the air floating part 610*a*. For example, the air floating part 610*a* may float the substrate 10 by an air cushion and transport the substrate 10 through the cleaning device 400 in the first direction DR1.

In an embodiment, after the electric field is applied to the substrate 10 through the electric field applying device 300, in a state in which the electric field is maintained on the substrate 10, the substrate 10 may be moved in the first direction DR1 by the air floating part 610*a* to pass through the cleaning device 400.

Figure 4B:
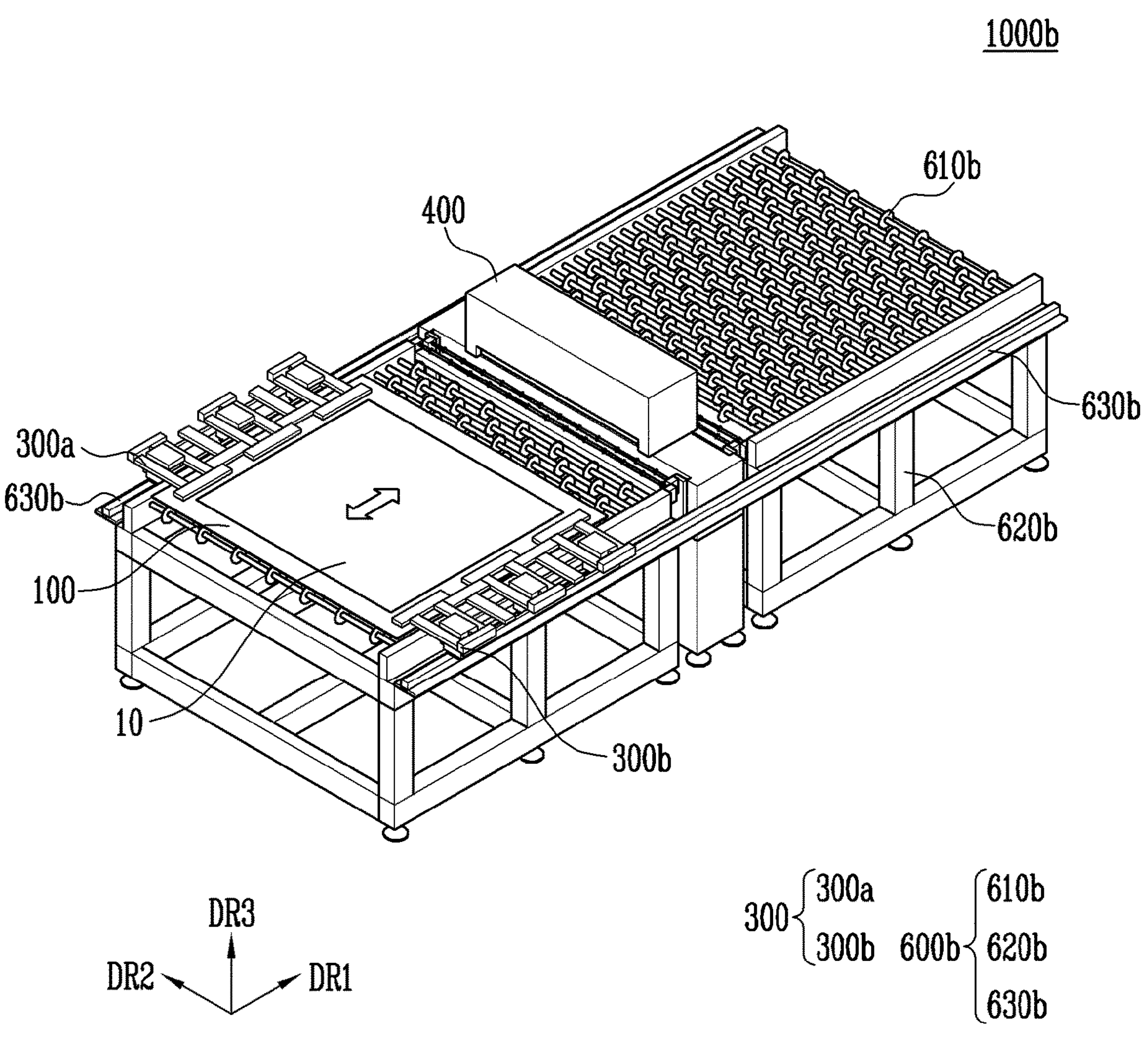

Referring to FIG. 4B, the apparatus 1000*b* for manufacturing a display device may include the substrate 10, the stage 100, the electric field applying device 300, the cleaning device 400, and the driving part 600*b*.

In an embodiment, the driving part 600*b* may include a conveyor 610*b*, a support frame 620*b*, and a guide member 630*b*.

In an embodiment, the conveyor 610*b* may include rollers. The rollers may be arranged in the first direction DR1. The conveyor 610*b* may be coupled to the guide member 630*b*. The guide member 630*b* may extend in the first direction DR1 and support the electric field applying device 300 disposed at the ends (e.g., both ends) of the substrate 10. The support frame 620*b* may support the conveyor 610*b* and the guide member 630*b*.

In an embodiment, the cleaning device 400 may be disposed in at least one area of the conveyor 610*b* disposed in the first direction DR1.

In an embodiment, the substrate 10 and the electric field applying device 300 coupled to the ends (e.g., both ends) of the substrate 10 and the guide member 630*b* may be moved along the guide member 630*b* by the conveyor 610*b*. The substrate 10 and the stage 100 may be moved in the first direction DR1 and pass through the cleaning device 400 disposed in the first direction DR1 of the substrate 10.

In an embodiment, after the electric field is applied to the substrate 10 through the electric field applying device 300, in a state in which the electric field is maintained on the substrate 10, the substrate 10 may be moved in the first direction DR1 by the conveyor 610*b* to pass through the cleaning device 400.

Figure 4C:
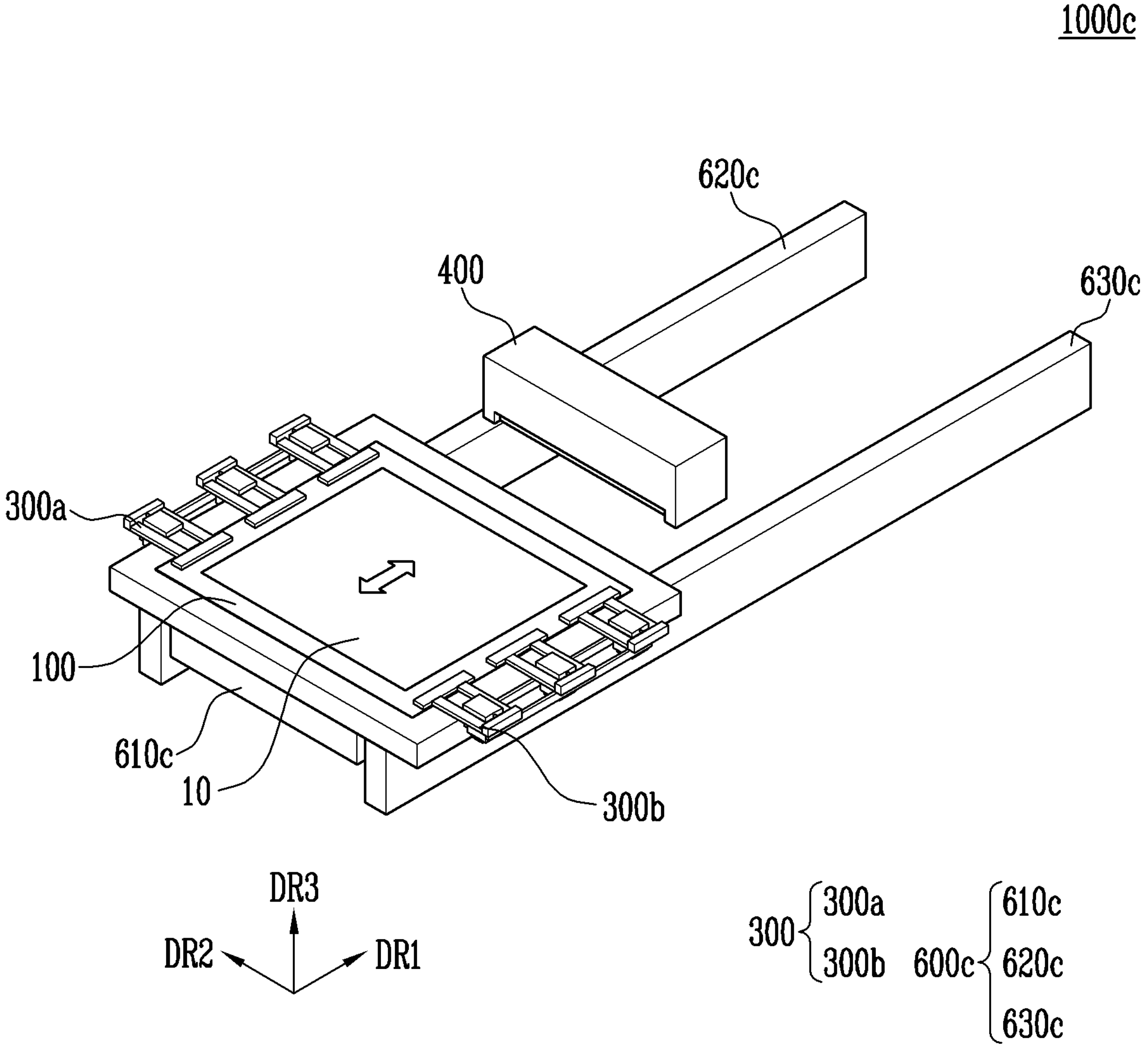

Referring to FIG. 4C, the apparatus 1000*c* for manufacturing a display device may include the substrate 10, the stage 100, the electric field applying device 300, the cleaning device 400, and the driving part 600*c*.

In an embodiment, the driving part 600*c* may include a transport device connected to the substrate 10.

In an embodiment, the driving part 600*c* may include a support part 610*c*, a first rail 620*c*, and a second rail 630*c*. The support part 610*c* may provide an area in which the substrate 10 is disposed. The driving part 600*c* may include the first rail 620*c* and the second rail 630*c* extending in the first direction DR1. The support part 610*c* may be disposed between the first rail 620*c* and the second rail 630*c* and may be moved in the first direction DR1 through a separate moving member (not shown). In an example, the driving part 600*c* may be connected to the substrate 10 through the first rail 620*c* and the second rail 630*c*. The driving part 600*c* may move the substrate 10 disposed on the support part 610*c* in the first direction DR1 and pass through the cleaning device 400. In an embodiment, the cleaning device 400 may be fixed between the first rail 620*c* and the second rail 630*c*.

In an embodiment, the substrate 10 and the electric field applying device 300 disposed at the ends (e.g., both ends) of the substrate 10 may be moved together with the support part 610*c* in the first direction DR1. For example, the substrate 10, the electric field applying device 300, and the support part 610*c* may be moved in the first direction DR1. The substrate 10 may be moved in the first direction DR1 and pass through the cleaning device 400 disposed in the first direction DR1 of the substrate 10.

In an embodiment, after the electric field is applied to the substrate 10 through the electric field applying device 300, in a state in which the electric field is maintained on the substrate 10, the substrate 10 may be moved in the first direction DR1 along the first rail 620*c* and the second rail 630*c* and pass through the cleaning device 400.

Figure 4D:
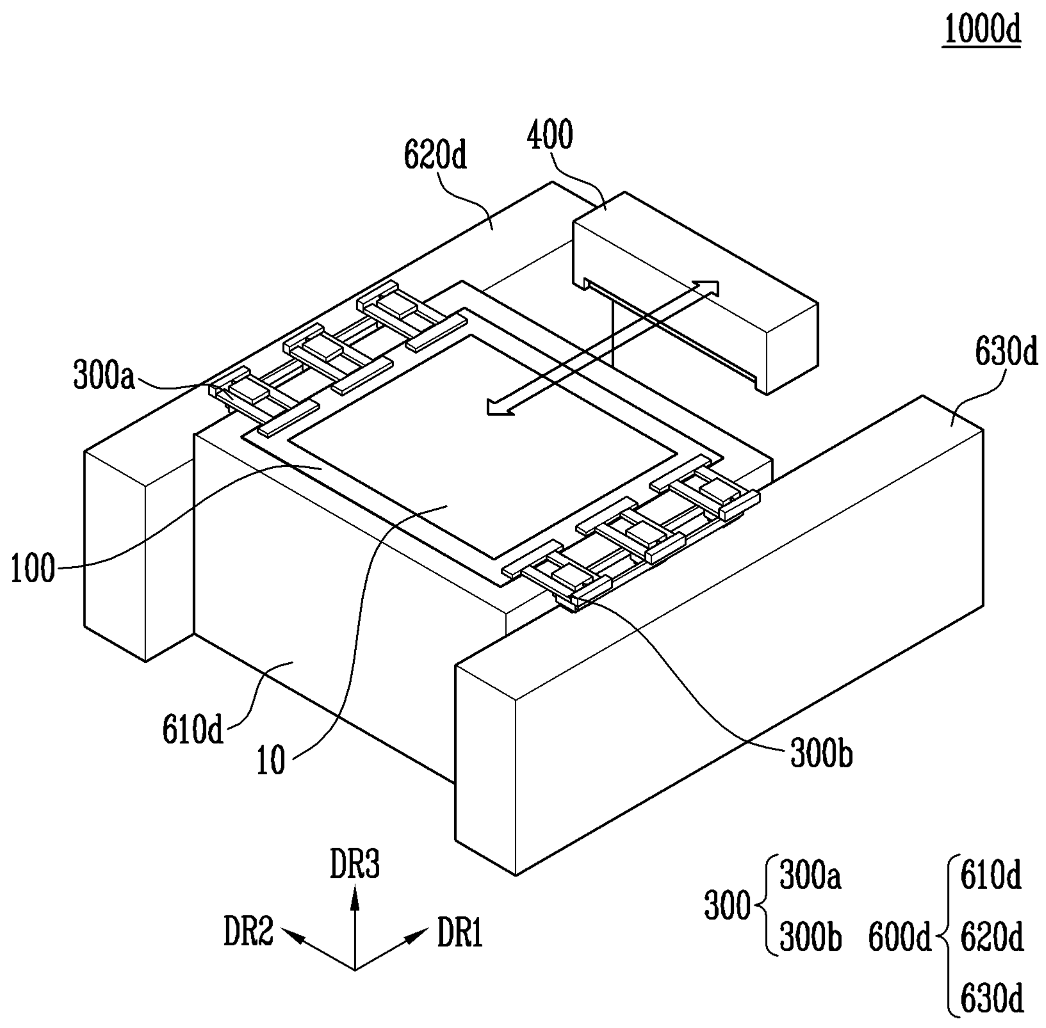

Referring to FIG. 4D, the apparatus 1000*d* for manufacturing a display device may include the substrate 10, the stage 100, the electric field applying device 300, the cleaning device 400, and the driving part 600*d*.

In an embodiment, the driving part 600*d* may include a transport device connected to (or extending from) the cleaning device 400.

Referring to FIG. 4D, the apparatus 1000*d* for manufacturing a display device may move the cleaning device 400 in the first direction DR1 using the driving part 600*d*. The cleaning device 400 may be moved in the first direction DR1 by the driving part 600*d* and pass through an upper side of the substrate 10 (e.g., in the third direction DR3).

In an embodiment, the driving part 600*d* may include a support frame 610*d*, a first rail 620*d*, and a second rail 630*d*. In an embodiment, the support frame 610*d* may fix the substrate 10 and the electric field applying device 300 coupled to the ends (e.g., both ends) of the substrate 10. The driving part 600*d* may include the first rail 620*d* and the second rail 630*d* extending in the first direction DR1. The cleaning device 400 may be disposed between the first rail 620*d* and the second rail 630*d* and may be moved in the first direction DR1 through a separate moving member (not shown).

In an example, the driving part 600*d* may be connected to (or extending from) the cleaning device 400 through the first rail 620*d* and the second rail 630*d*. The driving part 600*d* may move the cleaning device 400 in the first direction DR1 and pass through an upper portion of the substrate 10 disposed on the support frame 610*d*.

In an embodiment, after the electric field is applied to the substrate 10 through the electric field applying device 300, in a state in which the electric field is maintained on the substrate 10, the cleaning device 400 may be moved in the first direction DR1 along the first rail 620*d* and the second rail 630*d* and pass through the upper portion of the substrate 10.

Figure 5:
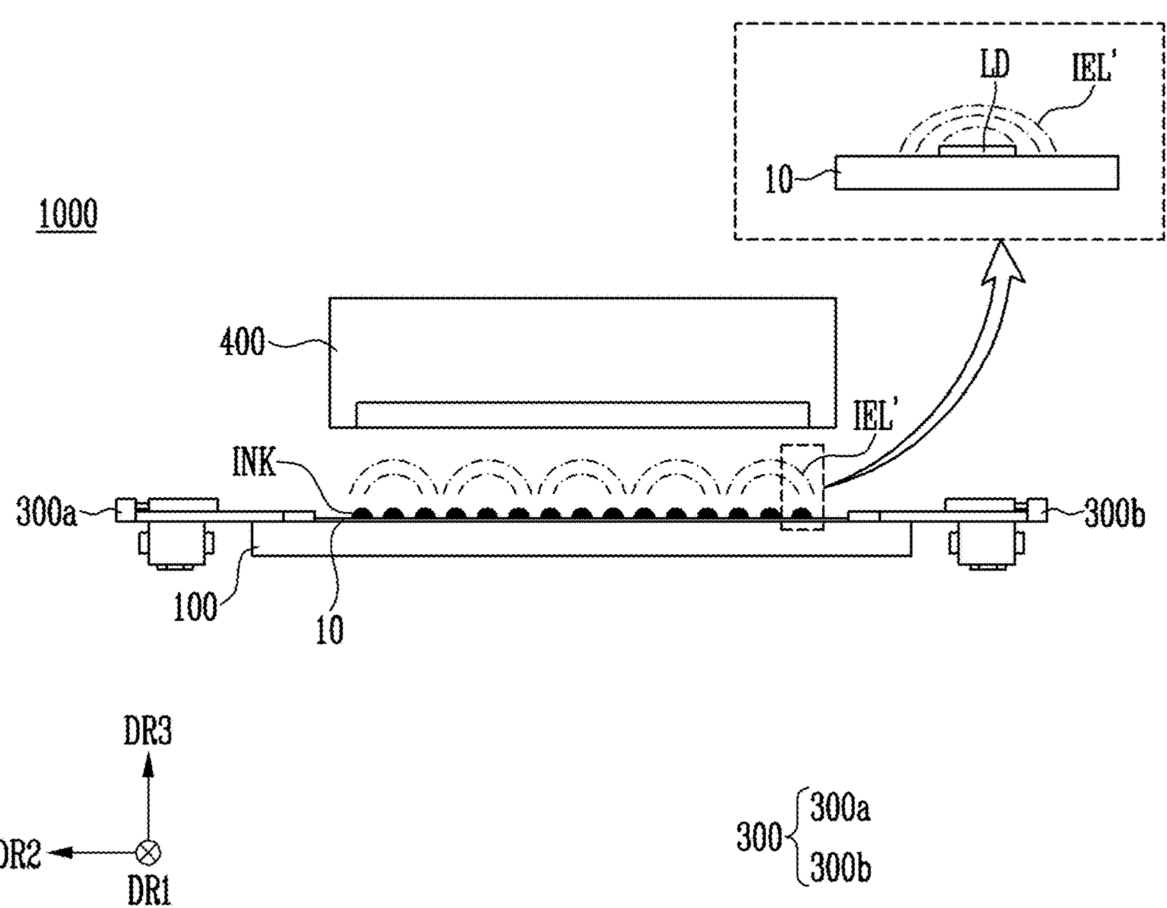
FIGS. 5 to 7 are schematic diagrams illustrating examples of operations of the apparatus for manufacturing a display device of FIG. 3.
Figure 6:
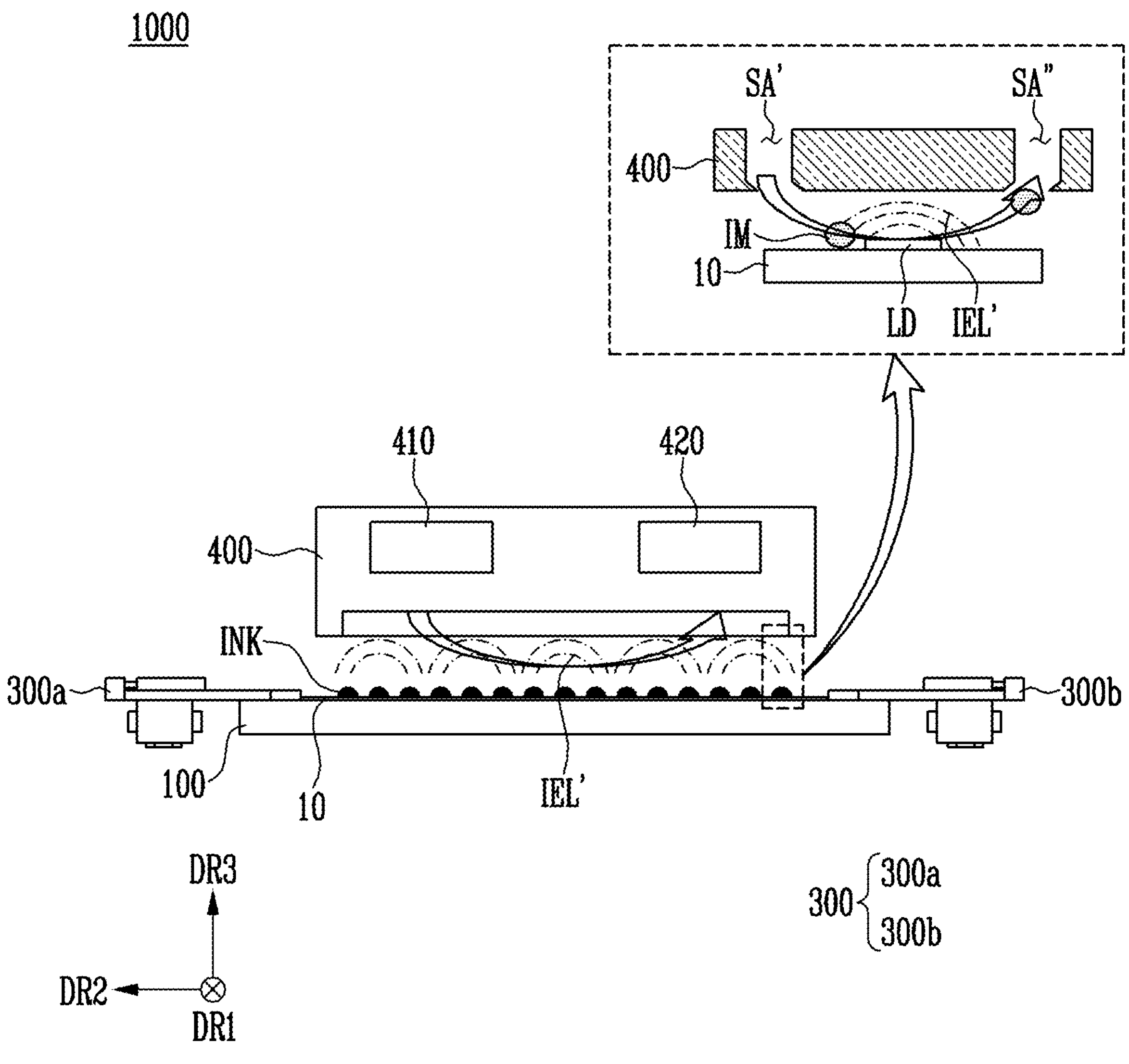
Figure 7:
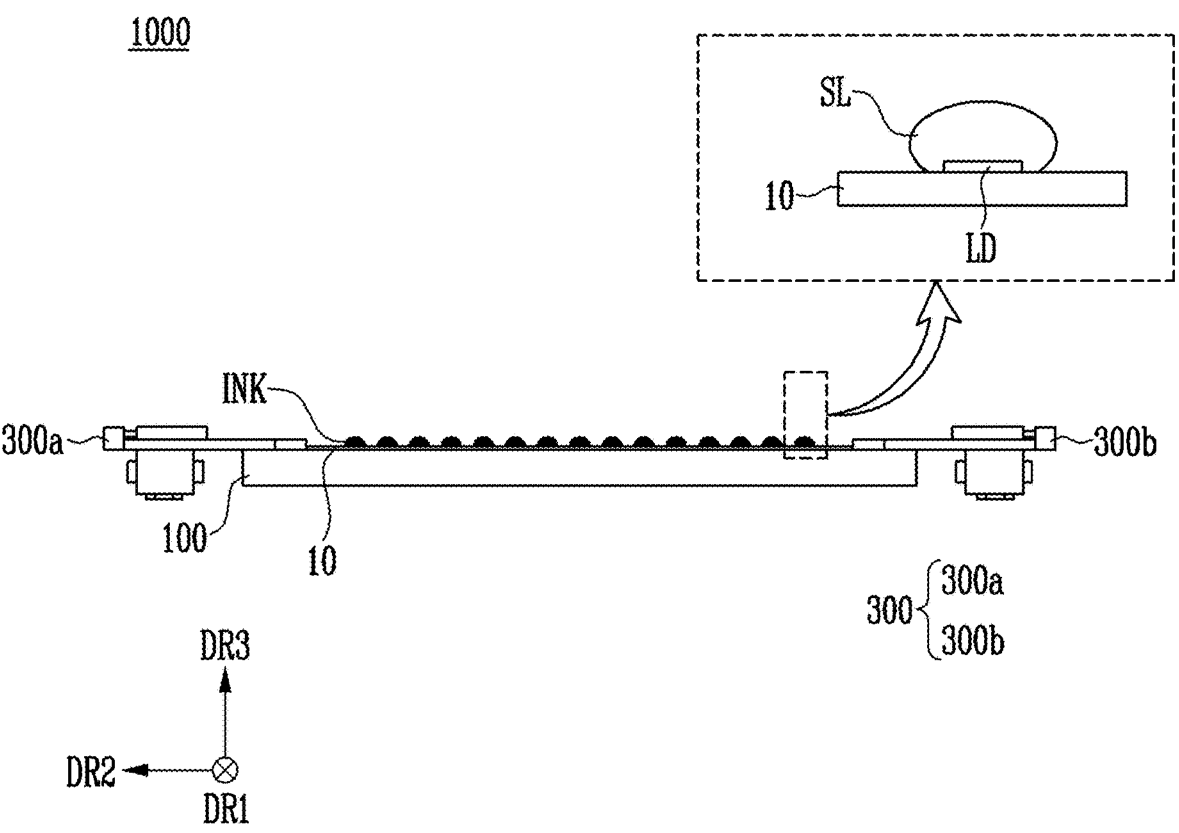

FIGS. 5 to 7 are schematic diagrams illustrating examples of operations of the apparatus 1000 for manufacturing a display device of FIG. 3.

Referring to FIG. 5, the substrate 10 may be disposed on an upper surface of the stage 100 (e.g., in the third direction DR3), and the ink INK may be sprayed onto the substrate 10 disposed on the stage 100. The substrate 10 onto which the ink INK is sprayed may be moved to a lower portion of the cleaning device 400 by the driving part (e.g., the driving parts 600*a* to 600*d* of FIGS. 4A to 4D).

In an embodiment, before foreign substances are removed from the substrate 10 by the operation of the cleaning device 400, the electric field applying device 300 may form the first electric field IEL' on the substrate 10.

In an embodiment, in case that the first electric field IEL' is formed on the substrate the light emitting element LD included in the ink INK may be fixed on the substrate 10 in a direction (e.g., a predetermined or selectable orientation direction) by the first electric field IEL'. In an example, the first electric field IEL' may include an electric field for fixing the light emitting element LD on the substrate 10.

Referring to FIG. 6, after the light emitting element LD included in the ink INK is fixed on the substrate 10 by the first electric field IEL', the cleaning device 400 may remove foreign substances IM from the substrate 10.

In an embodiment, the cleaning device 400 may include the gas supply part 410 and the suction part 420. In an example, the cleaning device 400 may spray gas onto the substrate through the gas supply part 410. The gas may disperse foreign substances on the substrate 10. The cleaning device 400 may suck (or inhale) residual gas and dispersed foreign substances IM through the suction part 420.

In an embodiment, the gas sprayed through the gas supply part 410 may include a dry gas. In an example, the drying gas may include at least one of clean dry air (CDA), oxygen ($O_2$), nitrogen ($N_2$), and argon (Ar). In an example, the gas may be provided as a compressive fluid for removing the foreign substances IM.

In an embodiment, the foreign substances IM may be dispersed on the surface of the substrate 10 by the gas sprayed through a spray area SA' of the cleaning device 400. The dispersed foreign substances IM may be sucked through a suction area SA" of the cleaning device 400.

In an embodiment, the foreign substances IM may be removed from the substrate 10 by the cleaning device 400, and the light emitting element LD may be fixed on the substrate 10 by the first electric field IEL' formed on the substrate 10. The apparatus 1000 for manufacturing a display device may remove the foreign substances from the substrate 10 using the cleaning device 400 without loss of the light emitting element LD.

Referring to FIG. 7, after the foreign substances are removed from the substrate 10, the substrate 10 and the stage 100 may pass through the cleaning device 400.

In an embodiment, after the foreign substances are removed from the substrate 10 by the cleaning device 400, the electric field applying device 300 may release the application of the first electric field IEL' to the substrate 10.

In an embodiment, the electric field applying device 300 may release the application of the first electric field IEL' after the operation of the cleaning device 400 is performed (or finished). The operation of releasing the application of the electric field by the electric field applying device 300 may include a state in which no voltage is applied to the substrate 10 by the electric field applying device 300.

In an embodiment, in case that the electric field applying device 300 releases the application of the first electric field IEL' to the substrate 10, the first electric field IEL' may no longer be formed on the substrate 10.

Figure 8:
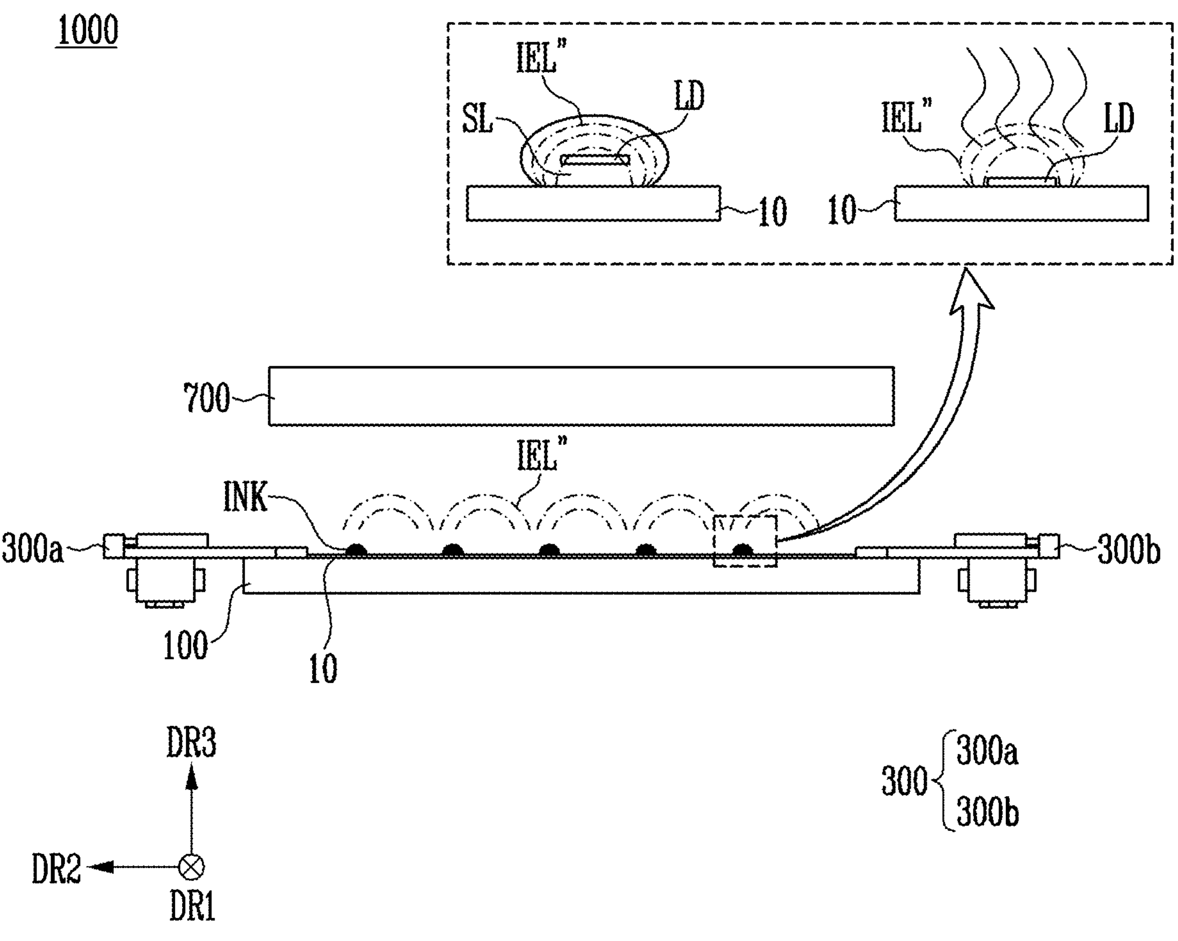
FIG. 8 is a schematic diagram illustrating an example of an operation of the apparatus for manufacturing a display device of FIG. 7.

FIG. 8 is a schematic diagram illustrating an example of an operation of the apparatus 1000 for manufacturing a display device of FIG. 7.

In an embodiment, after the electric field applying device 300 releases the application of the first electric field (e.g., the first electric field IEL' of FIG. 5) from the substrate 10, the electric field applying device 300 may apply the second electric field IEL" to the substrate 10. In case that the electric field applying device 300 applies the second electric field IEL" to the substrate 10, the second electric field IEL" may be formed on the substrate 10. In an example, the second electric field IEL" may include an electric field for aligning the light emitting element LD.

In an embodiment, in case that the second electric field IEL" is formed on the substrate 10, the light emitting element LD included in the ink INK may be arranged on the substrate 10 in an orientation direction (e.g., a predetermined or selectable orientation direction) by the second electric field IEL".

In an embodiment, after the cleaning process of removing the foreign substances from the substrate 10, a process for aligning the light emitting element LD may be performed. The foreign substances may be burned on the substrate 10 by the electric field applied to align the light emitting element LD, but side effects in which the substrate 10 is damaged or the light emitting element LD is not normally (or desirably) oriented due to the burned foreign substances can be minimized.

Referring to FIG. 8, the apparatus 1000 for manufacturing a display device may further include a light irradiation device 700.

In an embodiment, the light irradiation device 700 may evaporate a solvent SL included in the ink INK.

In an embodiment, in a state in which the second electric field IEL" formed on the substrate 10 is maintained, the light irradiation device 700 may irradiate light onto the substrate 10. The solvent SL included in the ink INK may be evaporated by the light irradiation device 700, and the light emitting element LD may be disposed on the substrate 10.

Figure 9:
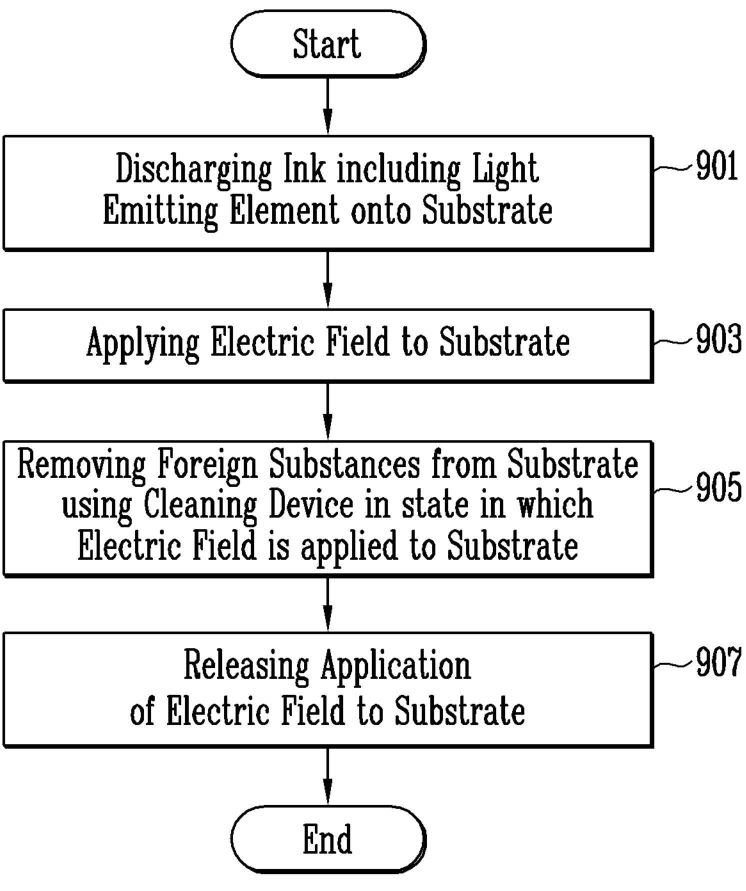
FIG. 9 is a flowchart schematically illustrating a method of manufacturing a display device according to embodiments of the disclosure.

FIG. 9 is a flowchart schematically illustrating a method of manufacturing a display device according to embodiments of the disclosure.

In operation 901, the apparatus 1000 for manufacturing a display device according to an embodiment may discharge the ink INK including the light emitting element LD onto the substrate 10.

In an embodiment, the apparatus 1000 for manufacturing a display device may discharge the ink INK including the solvent SL and the light emitting element LD onto the substrate 10 through the inkjet head 200.

In operation 903, the apparatus 1000 for manufacturing a display device according to an embodiment may apply the electric field to the substrate 10 through the electric field applying device 300. The electric field may include an electric field (e.g., the first electric field IEL' of FIG. 5) for fixing the light emitting element included in the ink INK.

In an embodiment, the apparatus 1000 for manufacturing a display device may apply the electric field for fixing the light emitting element LD to the substrate 10 through the electric field applying device 300. In case that the electric field applying device 300 applies the electric field to the substrate 10, the electric field may be formed on the substrate 10.

In operation 905, the apparatus 1000 for manufacturing a display device according to an embodiment may remove foreign substances from the substrate 10 by moving the cleaning device 400 in a state in which the electric field is applied to the substrate 10.

In an embodiment, in a state in which the light emitting element LD is fixed on the substrate 10 by the electric field, the cleaning device 400 may remove foreign substances from the substrate 10.

In operation 907, the apparatus 1000 for manufacturing a display device according to an embodiment may release the application of the electric field to the substrate 10.

In an embodiment, the operation of releasing the application of the electric field to the substrate 10 may a process in which the electric field is not formed on the substrate 10 because the electric field is not applied to the substrate 10.

Figure 10:
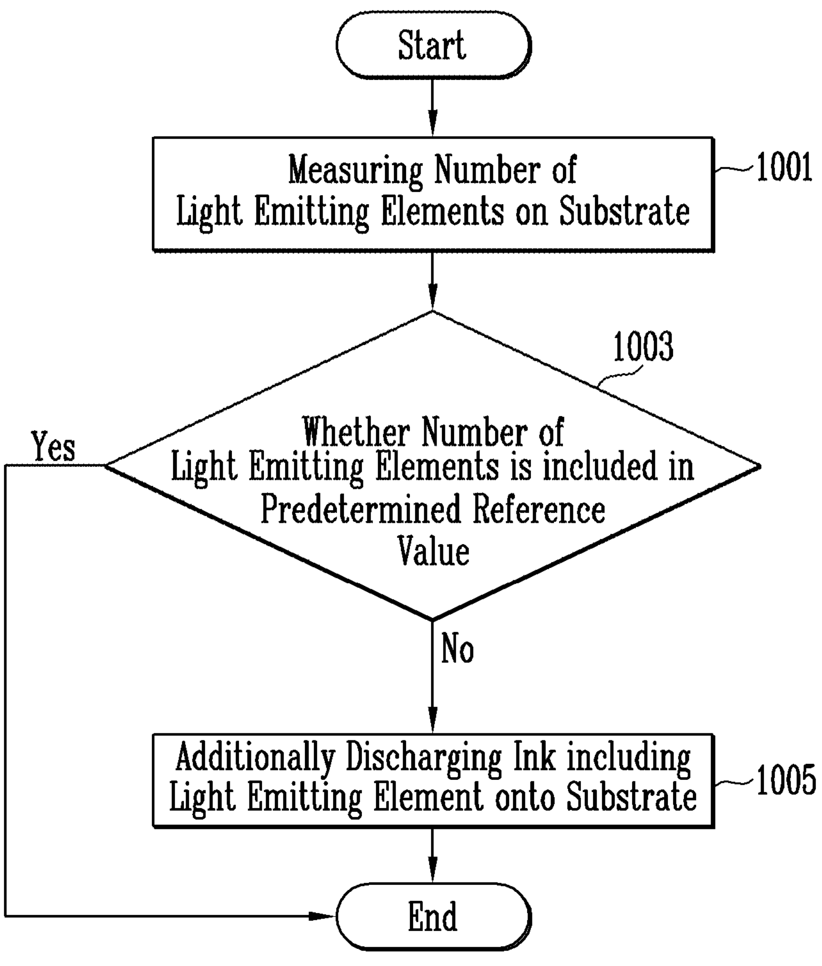
FIG. 10 is a schematic diagram illustrating an example of a subsequent process for the method of manufacturing a display device of FIG. 9.

FIG. 10 is a schematic diagram illustrating an example of a subsequent process for the method of manufacturing a display device of FIG. 9.

In an embodiment, the apparatus 1000 for manufacturing a display device may perform a subsequent process on the light emitting element LD after releasing the application of the electric field to the substrate 10 according to the operation 907 of FIG. 9.

In an embodiment, the apparatus 1000 for manufacturing a display device may further include a processor for controlling at least one of the substrate 10, the inkjet head 200, the electric field applying device 300, and the cleaning device 400.

In operation 1001, the apparatus 1000 for manufacturing a display device according to an embodiment may measure the number of light emitting elements LD on the substrate 10 through the processor.

In operation 1003, the apparatus 1000 for manufacturing a display device according to an embodiment may determine, through the processor, whether the number of light emitting elements LD is included in a reference voltage (e.g., a predetermined or selectable reference value or range).

In an embodiment, the reference value (or range) may correspond to data previously stored in the apparatus 1000 for manufacturing a display device, and may be changed according to the density, use, etc. of the light emitting element LD sprayed onto the substrate 10.

In an embodiment, the processor may control the inkjet head (e.g., the inkjet head 200 of FIG. 1) based on a result of comparing the number of light emitting elements LD with the reference value.

In operation 1005, in case that the number of light emitting elements LD is not included in the reference value, the apparatus 1000 for manufacturing a display device according to an embodiment may discharge (e.g., additionally discharge) an ink INK (e.g., an additional ink INK) including the light emitting element LD onto the substrate 10 through the inkjet head 200.

In an embodiment, in case that the measured number of light emitting elements LD is not included in the reference value, the inkjet head 200 may discharge (e.g., additionally discharge) the ink INK (e.g., the additional ink INK) onto the substrate 10. Thus, the number of light emitting elements LD may be included (or increased) in the reference value.

In an embodiment, in case that the number of the light emitting elements LD is included in the reference value, the apparatus 1000 for manufacturing a display device may not discharge (e.g., additionally discharge) the ink INK (e.g., the additional ink INK) including the light emitting element LD, and may perform a subsequent process on the light emitting element LD.

According to the apparatus for manufacturing a display device and the method for manufacturing a display device according to embodiments of the disclosure, after the ink including the light emitting element is discharged onto the substrate, to which the electric field is applied, foreign substances may be removed from the substrate without loss of the light emitting element.

In case that the electric field is applied to the substrate, the foreign substances may be burned on the substrate by the electric field. However, according to the embodiments of the disclosure, problems that the burned foreign substances damage the substrate, or the light emitting element is not normally (or desirably) oriented on the substrate due to the foreign substances can be solved.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. An apparatus for manufacturing a display device comprising:

a stage supporting a substrate;

an inkjet head discharging ink including light emitting elements onto the substrate;

an electric field applying device applying a first electric field to the substrate to fix the light emitting elements; and a cleaning device removing foreign substances from the substrate in a state in which the first electric field is applied to the substrate, wherein the electric field applying device releases application of the first electric field after the cleaning device removes the foreign substances, and wherein the electric field applying device applies a second electric field to the substrate to align the light emitting elements after the application of the first electric field is released.

2. The apparatus of claim 1, wherein the light emitting elements are arranged and fixed in a random direction by the first electric field, and the light emitting elements are arranged in a direction by the second electric field.

3. The apparatus of claim 1, further comprising:

a light irradiation device irradiating light to the substrate, wherein the light irradiation device irradiates the light onto the substrate in a state in which the second electric field is applied to the substrate.

4. The apparatus of claim 1, wherein the inkjet head discharges additional ink onto the substrate after the application of the first electric field is released.

5. The apparatus of claim 4, further comprising:

a processor controlling at least one of the substrate, the inkjet head, the electric field applying device, or the cleaning device, wherein the processor measures a number of the light emitting elements on the substrate and controls the inkjet head based on a result of comparing the number of the light emitting elements with a reference value.

6. The apparatus of claim 5, wherein the inkjet head discharges the additional ink onto the substrate in case that a measured number of the light emitting elements is not included in the reference value.

7. The apparatus of claim 1, wherein the cleaning device includes:

a gas supply part spraying gas onto the substrate; and a gas suction part sucking the foreign substances and residual gas from the substrate.

8. The apparatus of claim 1, further comprising:

a driving part driving the stage, wherein the driving part controls the stage so that the substrate to which the first electric field is applied passes through the cleaning device.

9. The apparatus of claim 8, wherein the driving part includes at least one of an air floating device, a roller conveyor device, a transport device connected to the substrate, or a transport device connected to the cleaning device.

10. The apparatus of claim 1, wherein the cleaning device includes an ultrasonic cleaner.

* * * * *